(12) United States Patent
Marr

(10) Patent No.: US 6,934,209 B2
(45) Date of Patent: Aug. 23, 2005

(54) TEMPERATURE COMPENSATED T-RAM MEMORY DEVICE AND METHOD

(75) Inventor: Ken W. Marr, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 103 days.

(21) Appl. No.: 10/404,859

(22) Filed: Mar. 31, 2003

(65) Prior Publication Data

US 2003/0227790 A1 Dec. 11, 2003

Related U.S. Application Data

(62) Division of application No. 10/165,665, filed on Jun. 6, 2002, now Pat. No. 6,781,907.

(51) Int. Cl.$^7$ ................................................ G11C 7/04
(52) U.S. Cl. ................... 365/211; 365/230.06; 327/512; 327/513; 327/132
(58) Field of Search ................ 365/211 O, 230.06; 327/512, 513, 132, 539

(56) References Cited

U.S. PATENT DOCUMENTS

| | | | |
|---|---|---|---|
| 4,387,449 A | 6/1983 | Masuda | 365/227 |
| 4,807,149 A | 2/1989 | Mehnert | 364/505 |
| 5,081,515 A | 1/1992 | Murata et al. | 357/42 |
| 5,745,415 A | 4/1998 | Marr | 365/201 |
| 5,805,508 A | 9/1998 | Tobita | 365/189.09 |
| 6,198,670 B1 | 3/2001 | Marr | 365/189.09 |
| 6,205,074 B1 | 3/2001 | Van Buskirk et al. | 365/211 |
| 6,288,966 B2 | 9/2001 | Marr | 365/226 |
| 6,330,195 B2 | 12/2001 | Marr | 365/189.09 |
| 6,337,813 B2 | 1/2002 | Marr | 365/189.09 |
| 6,350,635 B1 | 2/2002 | Noble et al. | 438/156 |
| 6,373,756 B2 | 4/2002 | Marr | 365/189.09 |
| 6,388,933 B2 | 5/2002 | Marr | 365/211 |
| 6,462,359 B1 | 10/2002 | Nemati et al. | 257/107 |
| 6,476,434 B1 | 11/2002 | Noble et al. | 257/302 |
| 6,492,233 B2 | 12/2002 | Forbes et al. | 438/270 |
| 6,496,422 B2 | 12/2002 | Marr | 365/189.09 |
| 6,504,201 B1 | 1/2003 | Noble et al. | 257/302 |
| 6,529,421 B1 | 3/2003 | Marr et al. | 365/189.09 |
| 6,556,068 B2 | 4/2003 | Forbes et al. | 327/537 |
| 6,627,924 B2 | 9/2003 | Hsu et al. | 257/133 |
| 6,628,558 B2 * | 9/2003 | Fiscus | 365/222 |
| 6,643,192 B2 | 11/2003 | Marotta et al. | 365/189.09 |
| 6,717,851 B2 * | 4/2004 | Mangan et al. | 365/185.11 |
| 6,762,474 B1 * | 7/2004 | Mills, Jr. | 257/469 |
| 2003/0035463 A1 | 2/2003 | Breinlinger | 374/178 |
| 2003/0067824 A1 | 4/2003 | Janzen | 365/222 |

* cited by examiner

Primary Examiner—VanThu Nguyen
(74) Attorney, Agent, or Firm—Dorsey & Whitney LLP (57) ABSTRACT

A T-RAM memory cell includes a temperature compensation device to adjust the gate-to-source voltage of an access transistor for the memory cell as a function of temperature so that the sub-threshold current of the transistor is insensitive to temperature variations. As a result, the sub-threshold current can be maintained slightly above the holding current of a thyristor used in the memory cell despite substantial temperature variations. In one embodiment, the temperature compensation device includes a current source directing a fixed current through a diode-connected transistor of the type used as the memory cell access transistor. Temperature induced changes in a reference voltage generated at the junction between the current source and the transistor therefore match the temperature induced changed in the sub-threshold current of the access transistor. As a result, the sub-threshold current of the access transistor can be made insensitive to temperature variations by applying the reference voltage to the gate or source of the access transistor.

9 Claims, 8 Drawing Sheets

TEMPERATURE COMPENSATED T-RAM MEMORY DEVICE AND METHOD

CROSS-REFERENCE TO RELATED APPLICATION

This application a divisional of pending U.S. patent application Ser. No. 10/165,665, filed Jun. 6, 2002 now U.S. Pat. No. 6,781,907.

TECHNICAL FIELD

The invention relates to memory devices, and, more particularly, to a memory device using T-RAM (thyristor-based SRAM) memory cells.

BACKGROUND OF THE INVENTION

Static random access memories ("SRAMs") have traditionally been implemented using memory cells formed by cross-coupled MOSFET transistors. Each memory cell is coupled to a pair of complementary digit lines by respective access transistors. Thus, each memory cell requires 4 transistors. As a result, SRAM memory cells are relatively large, and they can consume a significant amount of power. Attempts have therefore been made to devise alternative means for implementing SRAM memory cells.

Figure 1:
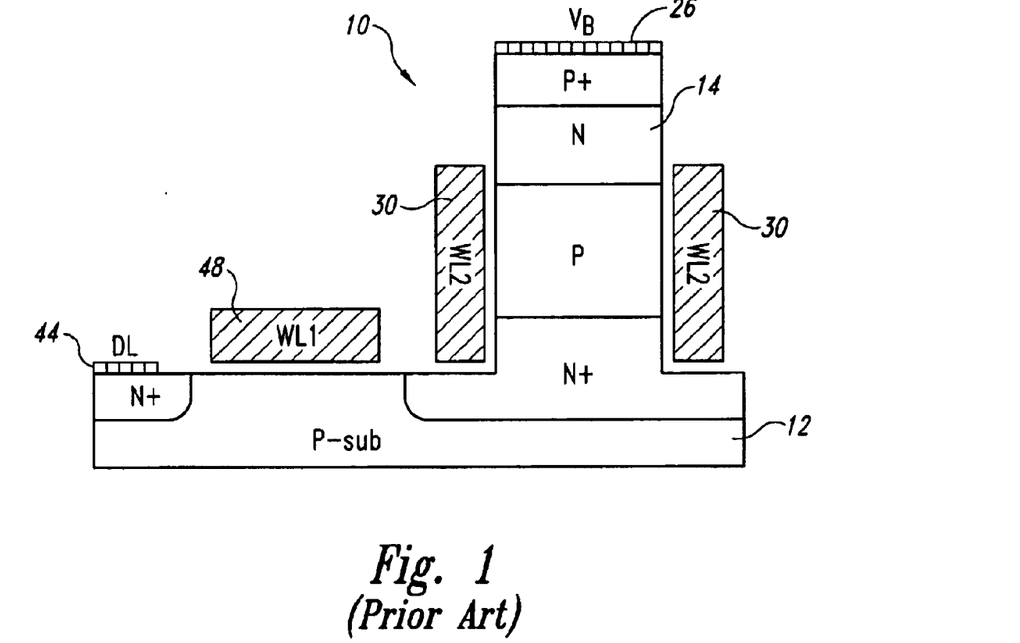
FIG. 1 is a schematic diagram showing a conventional T-RAM memory cell.
Figure 2:
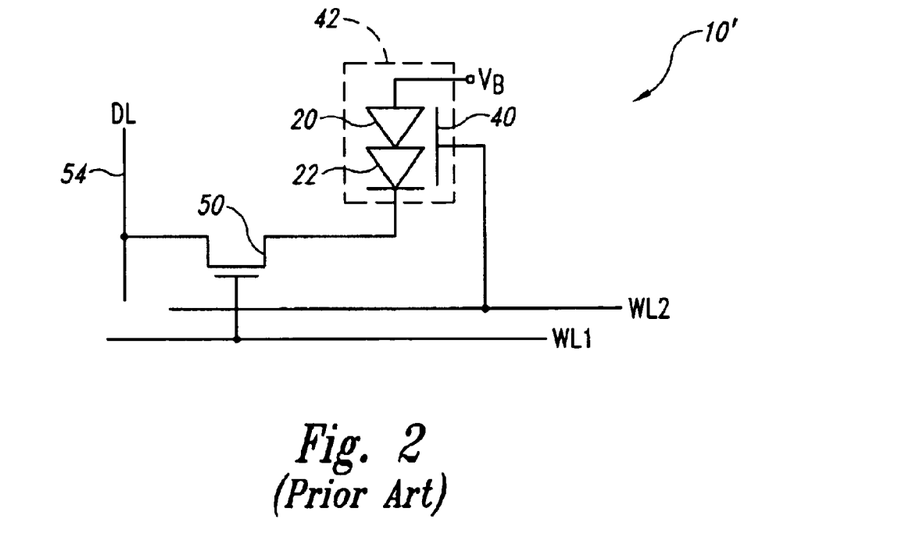
FIG. 2 is a schematic diagram showing the electrical circuit corresponding to the T-RAM memory cell of FIG. 1.

One approach to improving upon existing SRAM memory cell technology is the use of a thyristor as a data storage device. Thyristor-based SRAMs, known as T-RAMs, rely upon the principal that a thyristor, once activated to a conductive state, remains conductive as long as currents are flowing through the thyristor. An example of a T-RAM memory cell 10 is shown in FIG. 1, and its equivalent circuit 10' is shown in FIG. 2. With reference to FIG. 1, a p-type substrate 12 includes an upwardly projecting pillar 14, which, although not apparent from FIG. 1, preferably has a cylindrical configuration. The pillar 14 is doped in alternating N+, P, N, P+ regions to form a pair of series-connected diodes 20, 22, as shown in FIG. 2. A conductive contact layer 26 (FIG. 1) is deposited on the upper end of the pillar 14, and a bias voltage $V_B$ is applied to the contact layer 26. A word line electrode 30 (FIG. 1) is fabricated on, and extends around, the pillar 14 to form a thyristor gate 40 (FIG. 2). The diodes 20, 22 and the thyristor gate 40 form a thyristor 42 (FIG. 2). The above description provides an explanation of one embodiment of the structure of a prior art T-RAM memory cell and is not intended to imply any specific fabrication processing sequence.

With further reference to FIG. 1, the end of the substrate 12 opposite the pillar 14 is doped N+, and a digit line contact 44 is formed on the upper surface of the substrate 12 above the N+ region. Finally, a word line gate electrode 48 is fabricated on the upper surface of the substrate 12 between the digit line contact 44 and the pillar 14. The N+ regions below the contact 44, the N+ region at the bottom of the pillar 14, and the word line gate electrode 48 form an NMOS access transistor 50 (FIGS. 1 and 2). The access transistor 50 couples the thyristor 42 to a digit line 54 (FIG. 2) when the word line WL1 is driven high.

Figure 3:
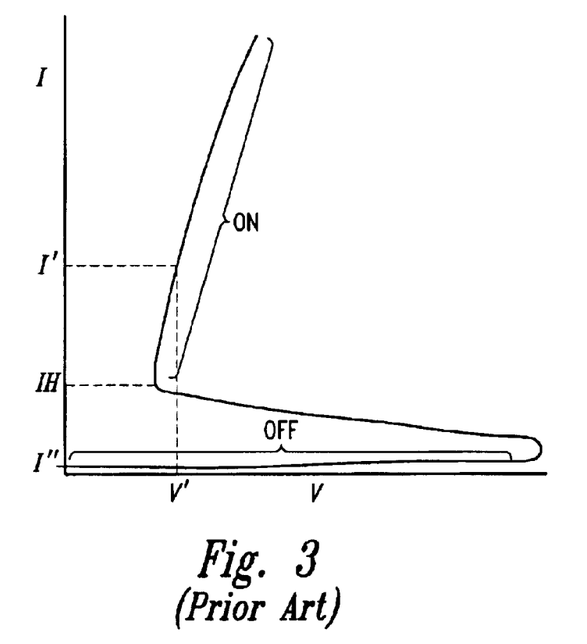
FIG. 3 is a graph showing the current/voltage characteristics of a thyristor used in the T-RAM memory cell of FIG. 1.

The operation of the T-RAM memory cell 10 shown in FIGS. 1 and 2 can best be explained by reference to a graph showing the electrical characteristics of the thyristor 42. The graph of FIG. 3 shows the current I flowing through the thyristor 42 plotted on the y-axis, and the voltage V across the thyristor 42 plotted on the x-axis. In the portion of the curve in which the current I is greater than $I_H$, the thyristor 42 is ON, i.e., conductive, and the lowest portion of the curve in which the current I is less than $I_H$, the thyristor 42 is OFF, ie., non-conductive. When the thyristor 42 is ON, the current I through it is relatively large, and its resistance, i.e., dV/dI, is relatively low. When the thyristor 42 is OFF, the current I through it is relatively small, and its resistance, i.e., dV/dI, is relatively high.

At a given voltage, V', the current I can be either a relatively large value I' (if the thyristor 42 is ON) or a relatively low value I" (if the thyristor 42 is OFF). Significantly, at this voltage V', the thyristor 42 will remain ON as long as the current flowing through the thyristor 42 is greater than a holding current $I_H$. Thus, by placing the thyristor 42 in a conductive state and then allowing current to flow through the thyristor 42, the current I will remain above $I_H$. The thyristor 42 thus "remembers" that it has been placed in a conductive state. If the same voltage V' is placed across the thyristor 42 and the thyristor 42 is placed in a non-conductive state, the current I will remain below $I_H$. The thyristor 42 thus "remembers" that it has been placed in a non-conductive state. In this manner, the thyristor 42 can serve as an SRAM memory cell.

In the memory cell 10' of FIG. 2, sufficient current flows through the access transistor 50 to maintain the thyristor 42 in a conductive state even though the transistor 50 has been turned OFF. This current, known as the "sub-threshold current" must nevertheless be large enough to maintain the current I through the thyristor 42 above the holding current $I_H$. If the sub-threshold current flowing through the thyristor 42 drops below the holding current $I_H$, the thyristor 42 can switch to the non-conductive state thereby losing the data bit stored in the thyristor 42. It is relatively simple to increase the sub-threshold current through the transistor 50 sufficiently to maintain the current I through the thyristor 42 well above the holding current $I_H$. However, if the current I is maintained at a level significantly above the holding current $I_H$, excess power is consumed, particularly in a high-capacity SRAM containing millions of thyristors. For this reason, it is preferable to maintain the sub-threshold current of the transistor 50 only slightly above the holding current $I_H$.

Figure 4:
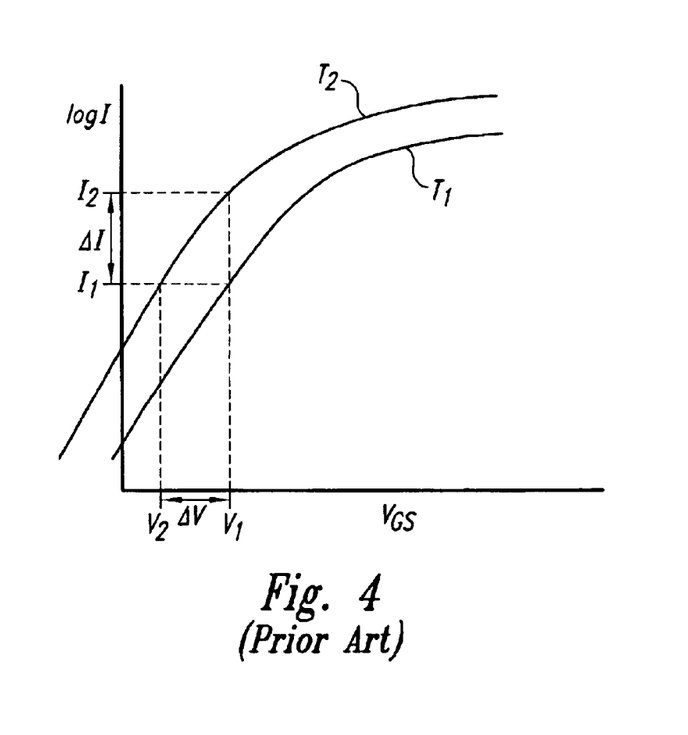
FIG. 4 is a graph showing the current/voltage characteristics of an access transistor used in the T-RAM memory cell of FIG. 1.

The sub-threshold current of the transistor 50 can be set to slightly above the holding current $I_H$ simply by adjusting the gate-to-source voltage $V_{GS}$ of the transistor 50. However, the sub-threshold current through the transistor 50 at a constant gate-to-source voltage $V_{GS}$ varies as a function of temperature, as shown in FIG. 4. The logarithm of the sub-threshold current is plotted on the y-axis of FIG. 4, and the gate-to-source voltage $V_{GS}$ is plotted on the x-axis for two different temperatures, $T_1$ and $T_2$. At the lower temperature, $T_1$, the current has a magnitude of $I_1$ when the voltage $V_{GS}$ is set to $V_1$. However, at that same voltage $V_1$, the current has a substantially higher magnitude of $I_2$ when the temperature of the transistor 50 has risen to $T_2$. Thus, at a constant voltage $V_1$, the current varies over a range $\Delta I$.

With reference, also, to FIG. 2, if the gate-to-source voltage of the transistor 50, i.e., the difference between the voltage on the digit line 54 and the voltage on the word line WL1, is maintained at a constant value, the sub-threshold current flowing through the thyristor 42 is in its conductive state will vary over a considerable range as the temperature of the thyristor 42 varies. If the voltage $V_{GS}$ is set to provide a sub-threshold current of I' at a relatively high temperature, the sub-threshold current may drop to below the holding current $I_H$ as the temperature of the thyristor 42 is reduced. Under these circumstances, the data bit corresponding to the thyristor 42 being in its conductive state would be lost. As mentioned earlier, this problem could be avoided by simply driving sufficient sub-threshold current through the thyristor 42 to prevent the current from dropping below the holding current $I_H$ at any temperature of the thyristor 42. But, doing so would unduly increase the power consumption of memory devices using T-RAM memory cells.

The inability to prevent data loss responsive to temperature variations without unduly increasing power consumption has prevented the widespread use of T-RAM memory cells. There is therefore a need for a solution to these problems, thereby making T-RAM memory devices practical.

SUMMARY OF THE INVENTION

A method and apparatus for temperature compensating a T-RAM memory cell having an access transistor applies a reference voltage to the access transistor, preferably to its gate, in a manner that adjusts the gate-to-source voltage of the access transistor. The magnitude of the reference voltage is a function of temperature so that the sub-threshold current of the access transistor is substantially insensitive to variations in temperature. The reference voltage is preferably generated by a temperature compensation device that includes a current source directing a current through a diode-connected transistor, preferably of the type used as the access transistor. The reference voltage is then generated at a junction between the current source and the diode-connected transistor.

DETAILED DESCRIPTION OF THE INVENTION

The principle of operation of the disclosed embodiments of the invention can best be explained with further reference to FIGS. 2–4. It will be recalled from the previous explanation of FIG. 3 that data loss in a T-RAM memory cell can be prevented by maintaining the sub-threshold current of the access transistor 50 (FIG. 2) at a constant level slightly above the holding current $I_H$ despite variations in temperature. With reference to FIG. 4, the sub-threshold current can be maintained at a constant level, for example $I_1$, by reducing the gate-to-source voltage from $V_1$ to $V_2$ as the temperature rises from $T_1$ to $T_2$. More specifically, the gate-to-source voltage is set to $V_1$ at the relatively low temperature $T_1$ to provides a sub-threshold current of $I_1$. The gate-to-source voltage is then reduced to $V_2$ to maintain the same sub-threshold current $I_1$ when the temperature increases to $T_2$. Thus, the gate-to-source voltage varies over a range $\Delta V$ to maintain a constant sub threshold current $I_1$ as the temperature changes between $T_1$ and $T_2$. As explained in detail below, the various embodiments of the invention automatically vary a gate-to-source reference voltage applied to the access transistor 50 (FIG. 2) as the temperature of the thyristor 42 varies, thereby maintaining the sub-threshold current of the transistor 50 constant despite these temperature variations. An alternative embodiment varies a bulk-to-source voltage of the access transistor 50 to accomplish the same purpose.

Figure 5:
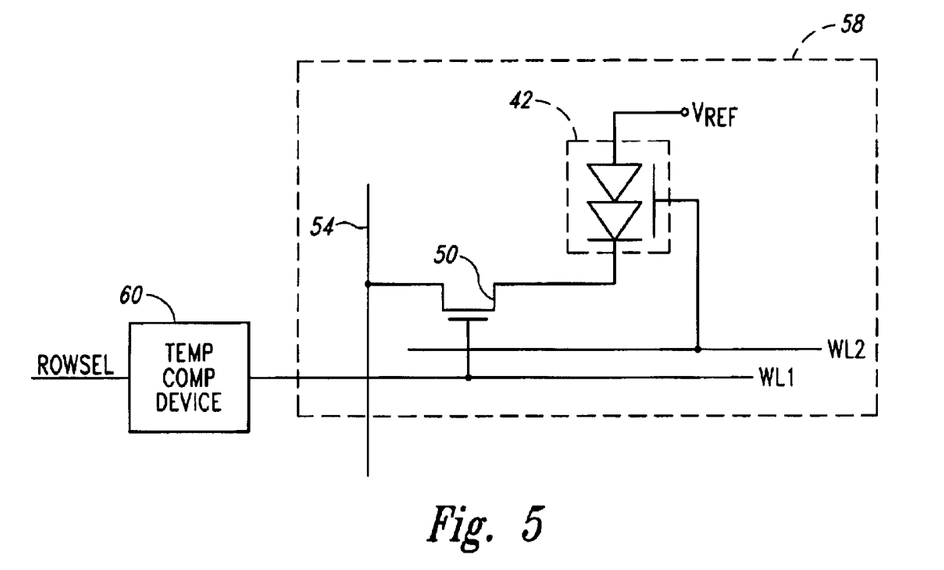
FIG. 5 is a schematic and block diagram a temperature compensation device in accordance with one embodiment of the invention coupled to a T-RAM memory cell.

FIG. 5 is a block diagram and schematic of a T-RAM memory cell 58 that has been temperature compensated in accordance with one embodiment of the invention. The memory cell 58 includes the same components as the memory cell 10 shown in FIG. 2. Therefore, in the interest of brevity, these components have been provided with the same reference numerals, and an explanation of their structure and operation will not be repeated. The memory cell 58 differs from the memory cell 10 shown in FIG. 2 by the inclusion of a temperature compensation device 60. The temperature compensation device 60 is coupled to the word line WL1 that drives the gates of the access transistors 50. The temperature compensation device 60 applies a word line voltage to the word line WL1 in either an active or an inactive state depending upon the state of a ROW SEL signal that is applied to the temperature compensation device 60. In the active state, the voltage of the word line WL1 has a magnitude that makes the access transistor 50 conductive, thereby coupling the thyristor 42 to the digit line 54. In the inactive state, the voltage of the word line WL1 has a magnitude that is adjusted in accordance with ambient temperature to which the thyristor 42 is exposed. More specifically, the magnitude of the reference voltage $V_{REF}$ is adjusted so that it decreases with increasing temperature. The change in the word line WL1 voltage thus reduces the gate-to-source voltage of the access transistor 50 as the temperature increases. Thus, with further reference to FIG. 4, reduction of the gate-to-source voltage of the transistor 50 as the temperature rises can maintain the sub-threshold current of the transistor 50 constant despite such changes in temperature.

Figure 6:
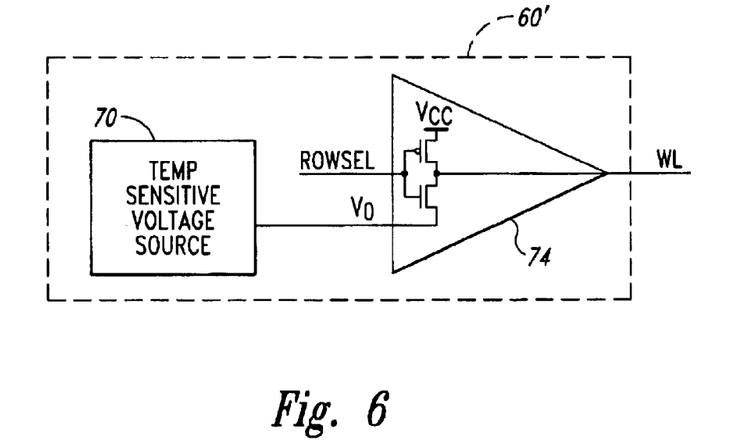
FIG. 6 is a block diagram of a temperature compensation device used in the temperature compensation device of FIG. 5.

One embodiment of the temperature compensation device 60 is shown in FIG. 6. The temperature compensation device 60' includes a temperature sensitive voltage source 70 having an output coupled to an input of a driver 74. The driver 74 receives a voltage $V_0$ from the temperature sensitive voltage source 70 and then provides a corresponding [reference voltage $V_{REF}$]word line voltage WL when ROW SEL input is high. Although a separate driver 74 is shown in the embodiment of FIG. 6, it will be understood that the temperature sensitive voltage source 70 may alternatively have sufficient current driving capability that the separate driver 74 may not be required.

Figure 7:
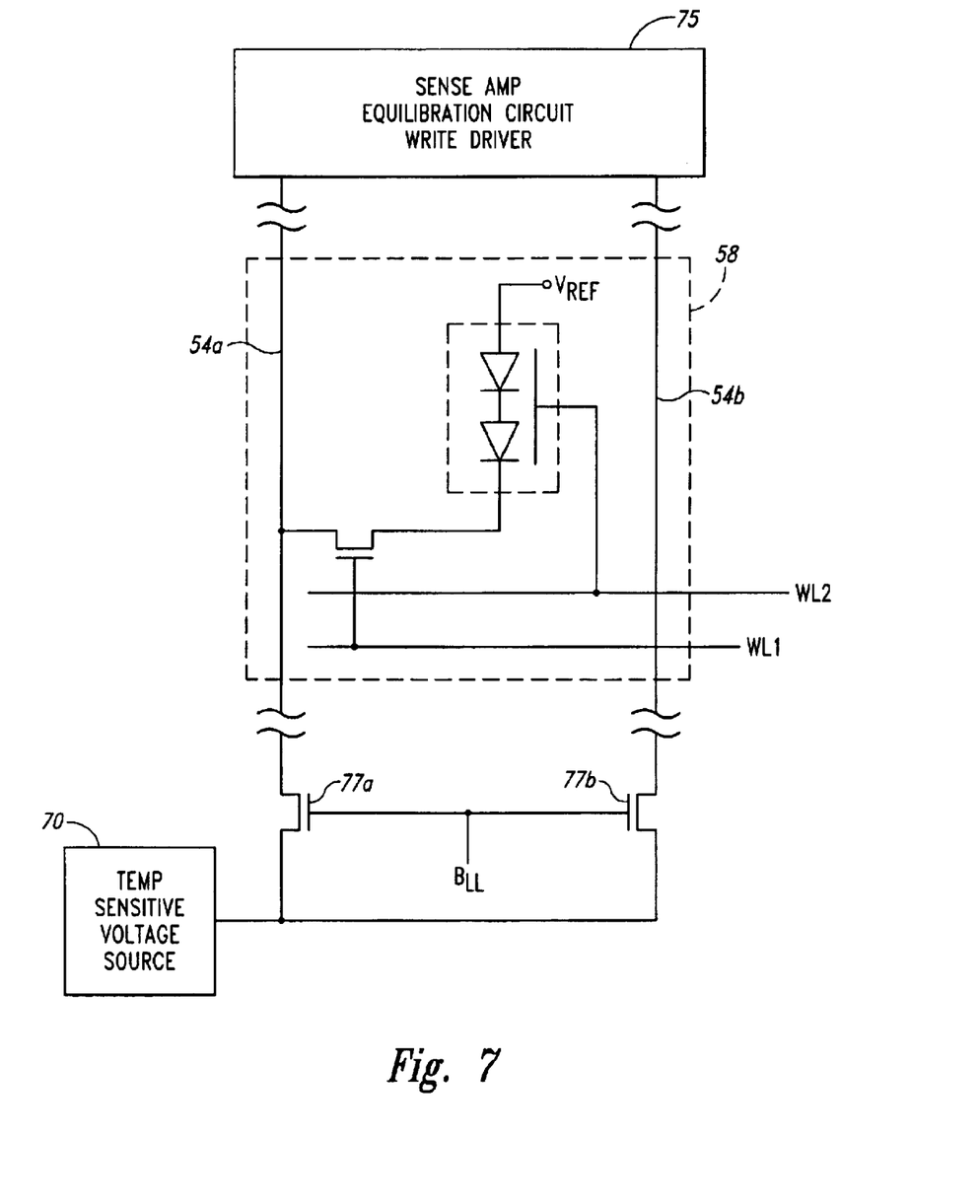
FIG. 7 is a schematic and block diagram a temperature compensation device in accordance with another embodiment of the invention coupled to a T-RAM memory cell.

FIG. 7 is a block diagram and schematic of a T-RAM memory cell 58 that has been temperature compensated in accordance with another embodiment of the invention. The memory cell 58 includes the same components as the memory cells shown in FIGS. 2 and 5. Therefore, in the interest of brevity, these components have been provided with the same reference numerals, and an explanation of their structure and operation will not be repeated. The difference between the embodiment of FIG. 5 and the embodiment of FIG. 7 is that, in FIG. 7, the gate-to-source voltage of the access transistor 50 is compensated by adjusting the voltage of the digit line 54a. In contrast, in the embodiment of FIG. 5, the gate-to-source voltage of the access transistor 50 is compensated by adjusting the voltage on the gate of the access transistor 50.

With further reference to FIG. 7, complementary digit lines 54a,b are coupled to a conventional or hereinafter developed sense amplifier, equilibration circuit and write drivers 75. The digit lines 54a,b, only a part of which is shown in FIG. 7, are also coupled to the temperature sensitive voltage source through respective NMOS transistors 77a,b respectively. The conductive states of the transistors 77a,b are controlled by a bit line load ("BLL") signal in a conventional manner. However, transistors like the transistors 77a,b are conventionally used to couple a supply voltage, rather than a temperature controlled voltage, to the digit lines 54a,b.

In operation, the BLL signal renders the transistors 77a,b conductive to couple the temperature sensitive voltage source 70 to the digit line 54a. As previously explained, the voltage at the output of the temperature sensitive voltage source 70 is adjusted in accordance with ambient temperature to which the thyristor 42 is exposed. More specifically, the voltage supplied by the temperature sensitive voltage source 70 is adjusted so that it increases with increasing temperature. The resulting reduction of the gate-to-source voltage of the transistor 50 as the temperature rises can maintain the sub-threshold current of the transistor 50 constant despite such changes in temperature.

Figure 8:
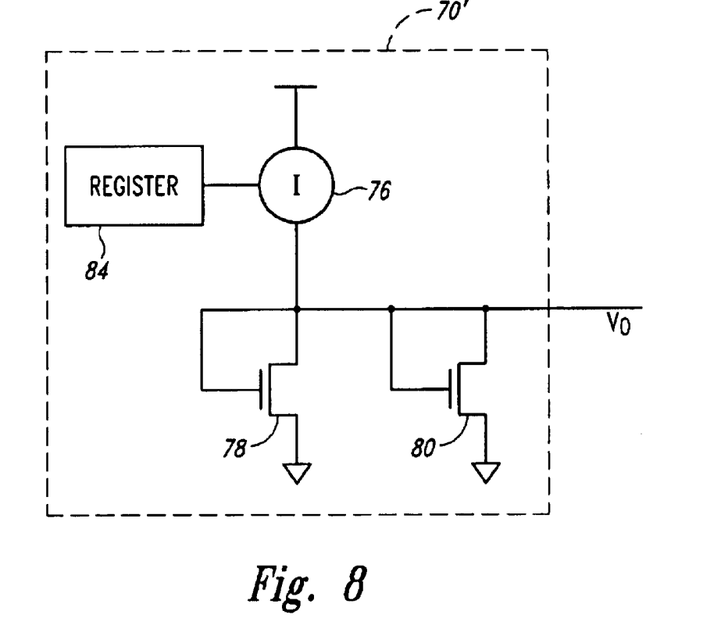
FIG. 8 is a schematic and block diagram of one embodiment of a temperature sensitive voltage source used in the temperature compensation device of FIGS. 5 and 7.

One embodiment of the temperature sensitive voltage source 70 is illustrated in FIG. 8. The temperature sensitive voltage source 70' includes a current source 76, which is preferably a bandgap-based current source in which the magnitude provided by the current source 76 varies with temperature in a predetermined manner. The current source 76 is coupled to a plurality of diode-connected NMOS transistors 78, 80. However, it will be understood that a fewer or greater number of transistors 78, 80 may be used. The magnitude of the current provided by the current source 76 is controlled by the programming of a non-volatile register 84. The non-volatile register 84 may be implement, for example, by a set of programmable antifuses, a mode register, or any other circuit that is capable of being programmed to store information corresponding to the desired current provided by the current source 76.

In operation, the current source 76 provides a constant current, the magnitude of which is set by the non-volatile register 84. With reference, also to FIG. 4, if it is assumed that the current provided by the current source 76 is equal to $I_1$ shown in FIG. 4, then at a temperature of $T_1$ the voltage $V_O$ will be equal to $V_1$. As long as the current provided by the current source 74 remains at $I_1$, the voltage $V_O$ will decrease to $V_2$ when the temperature rises to a temperature of $T_2$. Thus, magnitude of the voltage $V_O$ automatically decreases as the temperature increases, and vice-versa. Further, since the transistors 78, 80 are NMOS transistors like the access transistor 50, they have the same current/voltage characteristics as shown in FIG. 4. Therefore, the adjustment of the voltage $V_O$ will inherently maintain the sub-threshold current constant despite variations in ambient temperature.

The non-volatile register 84 is used to adjust the current and temperature coefficient, if any, provided by the current source 76 to adjust the temperature sensitive voltage source 70 for process variations and the like. In some embodiments, the non-volatile register 84 can be eliminated and the current source 76 can simply be designed to provide the correct current.

Figure 9:
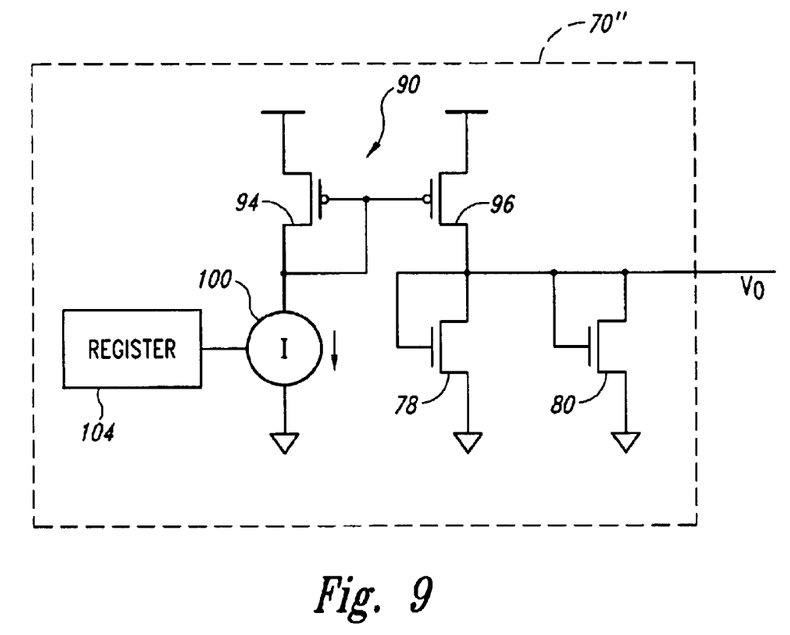
FIG. 9 is a schematic and block diagram of another embodiment of a temperature sensitive voltage source used in the temperature compensation device of FIGS. 5 and 7.

Another embodiment of the temperature sensitive voltage source 70 shown in FIG. 6 is shown in FIG. 9. The temperature sensitive voltage source 70" shown in FIG. 6, like the temperature sensitive voltage source 70' shown in FIG. 8, includes the same NMOS transistors 78, 80 operating in the same manner as explained above with respect to FIG. 8. However, instead of using a current source 76, the temperature sensitive voltage source 70" of FIG. 9 uses a current mirror 90 formed by a pair of PMOS transistors 94, 96. The transistor 94 is coupled in series with a current source 100 producing a current having a magnitude and temperature coefficient controlled by a non-volatile register 104, which performs the same function as the non-volatile register 84 shown in FIG. 8.

In operation, the current source 100 draws a current through the transistor 94 having a magnitude determined by the non-volatile register 104. With reference also to FIG. 4, setting the current at a predetermined value, e.g., $I_1$, also sets the gate-to-source or source-to-bulk voltage of the transistor 94 as a function of its current/voltage characteristics. Using the current/voltage characteristics shown in FIG. 4, setting the current to $I_1$ sets the gate-to-source voltage at $V_1$. As it is well-known in the art of current mirror design, the transistor 96 has the same gate-to-source voltage as the transistor 94 because of its connection thereto, and therefore provides the same current $I_1$. Thus, the transistor 96 drives the NMOS transistors 78, 80 with the current $I_1$. The transistors 78, 80 then generate the voltage $V_O$ to properly temperature compensate the access transistor 50 in the same manner as described above with reference to FIG. 8. Again, the non-volatile register 104 may be eliminated in certain embodiments.

Figure 10:
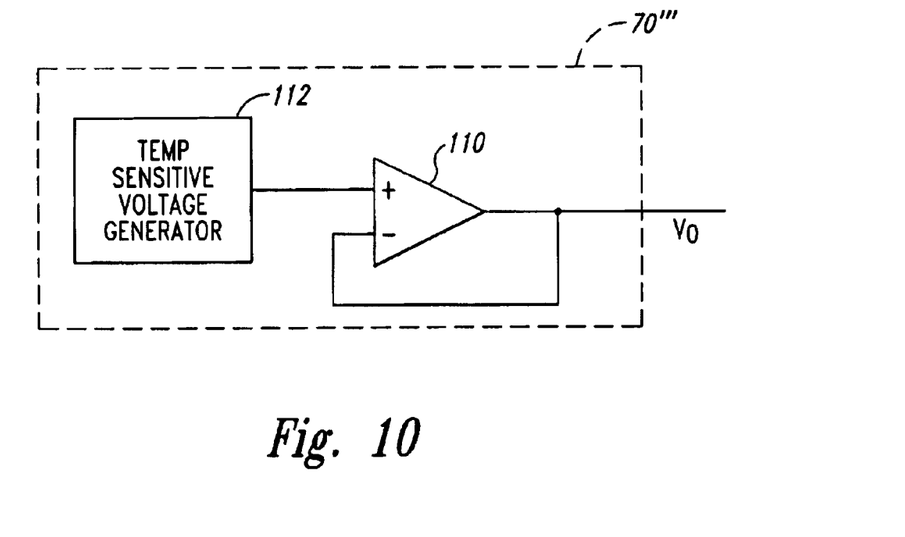
FIG. 10 is a schematic of another embodiment of a temperature sensitive voltage source used in the temperature compensation device of FIGS. 5 and 7.

Another embodiment of the temperature sensitive voltage source 70 shown in FIG. 6 is shown in FIG. 10. The temperature sensitive voltage source 70'" is implemented with an operational amplifier 110 connected as a voltage-follower. As it is well-known in the art, a voltage-follower presents a high input impedance to a temperature sensitive voltage generator 112 but it has a relatively low output impedance to drive the word line WL1.

Figure 11:
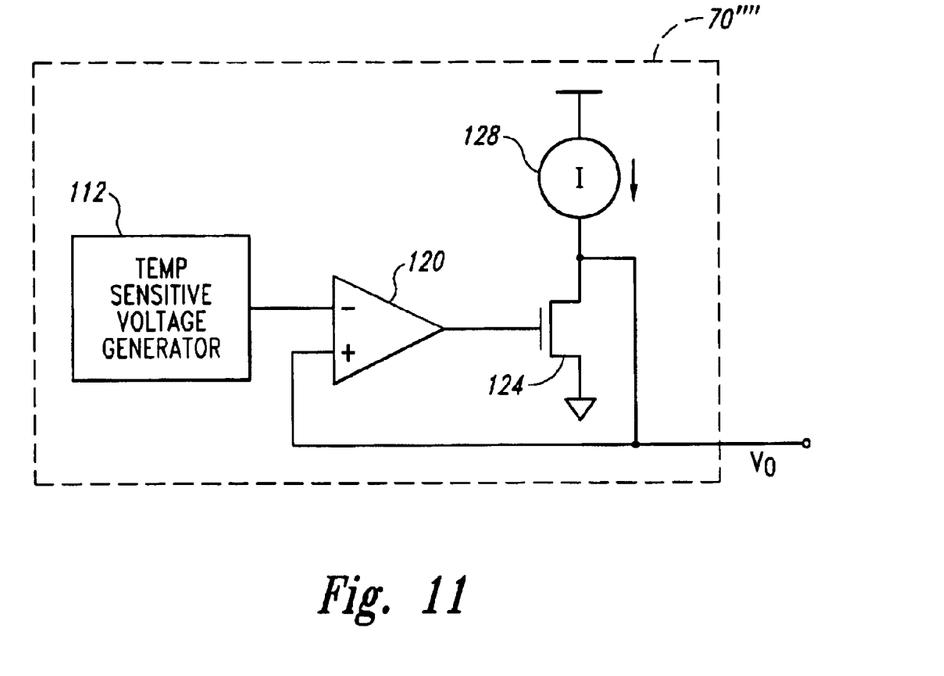
FIG. 11 is a schematic of still another embodiment of a temperature sensitive voltage source used in the temperature compensation device of FIGS. 5 and 7.

Still another embodiment of the temperature sensitive voltage source 70 shown in FIG. 6 is shown in FIG. 11. The temperature sensitive voltage source 70"" again includes an operational amplifier 120 connected as a voltage-follower, but the operational amplifier 120 drives an NMOS transistor 124 rather than the word line WL1. The NMOS transistor 124 is connected in series with a current source 128, and the output voltage $V_o$ is generated at the junction between the transistor 124 and current source 128. The output voltage $V_o$ is also fed back to the inverting terminal of the operational amplifier 120. The inverting terminal of the operational amplifier 120 is coupled to the output of the temperature sensitive voltage generator 112, which generates a voltage that varies with temperature in a predetermined manner.

In operation, an increase in voltage at the output of the temperature sensitive voltage generator 112 causes a decrease in the voltage at the output of the operational amplifier 120. This decreased voltage at the output of the amplifier 120 increases the drain-source resistance of the transistor 124. However, since a constant current provided by the current source 128 flows through the transistor 124, the voltage $V_o$ developed across the transistor 124 increases. Because of the feedback to the non-inverting input of the amplifier 120, the voltage $V_o$ rises until it substantially matches the increase in voltage at the output of the temperature sensitive voltage generator 112. The temperature sensitive voltage generator 70"" responds to decreases in the voltage at the output of the temperature sensitive voltage generator 112 in a similar manner. Also, of course, embodiments of the temperature sensitive voltage source 70 shown other than the embodiments shown FIGS. 8–11 may be used.

Figure 12:
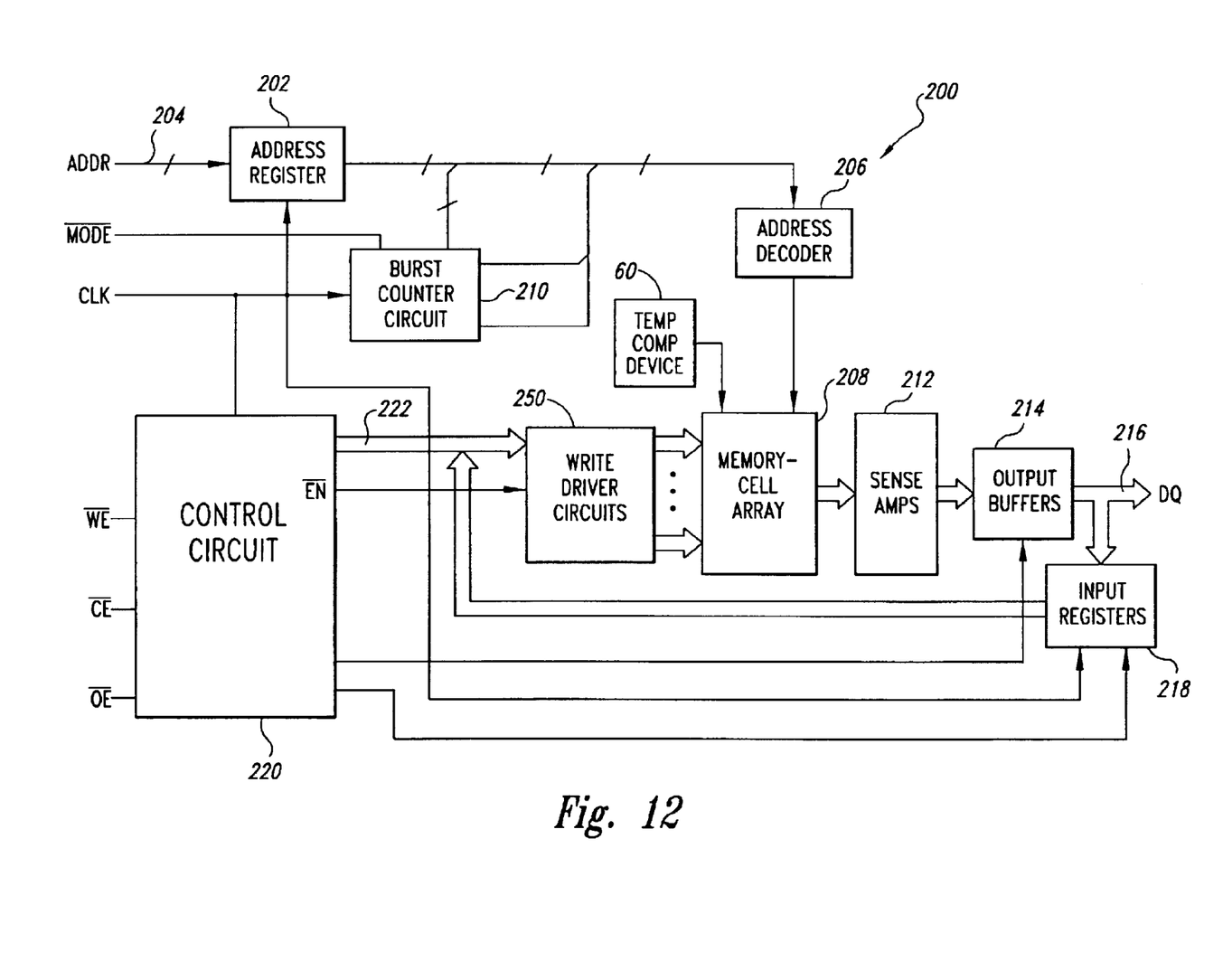
FIG. 12 is a block diagram of a synchronous SRAM using T-RAM memory cells temperature compensated using the temperature compensation device of FIG. 5.

One embodiment of a synchronous SRAM 200 using the T-RAM memory cell 58 shown in FIG. 5 or 7 is shown in FIG. 12. In the synchronous SRAM 200, all operations are referenced to a particular edge of an external clock signal CLK, typically the rising edge, as known in the art. The synchronous SRAM 200 includes an address register 202 that latches an address received on an address bus 204 in response to the external clock signal CLK. An address decoder 206 receives the latched address from the address register 202 and outputs a decoded address to a memory-cell array 208 using T-RAM memory cells of the type shown in FIGS. 2, 5 and 7 arranged in rows and columns. The temperature compensation device 60 shown in either FIG. 5 or FIG. 7 is coupled to the memory cell array 208 to bias the wordlines in the array 208 with a voltage that is adjusted as a function of ambient temperature, as previously explained. The latched address stored in the address register 202 is also output to a burst counter circuit 210 receiving the external clock signal CLK and a mode signal $\overline{\text{MODE}}$. In response to the external clock signal CLK, the burst counter circuit 210 develops sequential addresses beginning with the memory address latched by the address register 202, and outputs the sequential addresses to the address decoder 206. The mode signal $\overline{\text{MODE}}$ determines whether the sequence of memory addresses developed by the burst counter circuit 210 is a linear burst sequence or an interleaved burst sequence.

Sense amplifiers 212 are coupled between complementary digit lines in respective columns of the memory-cell array 208 and operate to sense the data stored in addressed T-RAM memory cells in the memory-cell array 208. The sense amplifiers 212 output the sensed data through an output buffer circuit 214 and onto a data bus 216. An input register 218 latches data placed on the data bus 216 in response to the external clock signal CLK. The data latched in the input register 218 is output to write driver circuits 250, which are, in turn, coupled to the memory-cell array 208 and operate as previously described to write data to addressed memory cells in the memory-cell array 208. Typically, there is one write driver circuit 250 for each line on the data bus 216.

The synchronous SRAM 200 further includes a control circuit 220 that controls operation of the various components of the synchronous SRAM 200 during data transfer operations and during testing of the synchronous SRAM. The control circuit 220 receives the external clock signal CLK, an output enable signal $\overline{\text{OE}}$, a chip enable signal $\overline{\text{CE}}$, and a write enable signal $\overline{\text{WE}}$, and generates a number of internal control signals to control the various components of the synchronous SRAM 100 in response to these signals. The control circuit 220 may also be coupled to the write driver circuits 250 through a test data bus 222 on which test data is applied during the test mode of operation.

During a read data transfer operation, an external circuit (not shown in FIG. 12) places an address on the address bus 204, activates the output enable signal $\overline{\text{OE}}$ and the chip enable signal $\overline{\text{CE}}$, and deactivates the write enable signal $\overline{\text{WE}}$. The address on the address bus 204 is latched by the address register 202 on the next rising edge of the external clock signal CLK. In response to the high write enable signal $\overline{\text{WE}}$ and low output enable signal $\overline{\text{OE}}$, the control circuit 220 disables the input register circuit 218 and places the output buffer circuit 214 in a low impedance state coupling the data bus 216 to the sense amplifiers 212. Typically, on the next subsequent rising edge of the external clock signal CLK, the latched address stored in the address register 202 is output to the address decoder 206, which decodes the memory address and activates the addressed memory cells in the memory-cell array 208. The sense amplifiers 212 thereafter sense the data stored in the addressed memory cells and outputs the data to the output buffer circuit 214 which, in turn, places the data on the data bus 216 where it is available to be read by the external circuit.

During a write data transfer operation, the external circuit (not shown) places an address on the address bus 204, data on the data bus 216, deactivates the output enable signal $\overline{\text{OE}}$, and activates the chip enable signal $\overline{\text{CE}}$ and write enable signal $\overline{\text{WE}}$. In response to the active write enable signal $\overline{\text{WE}}$ and inactive output enable signal $\overline{\text{OE}}$, the control circuit 220 places the output buffer circuit 214 in a high impedance state and enables the input register 218. On the next subsequent rising edge of the external clock signal CLK, the address register 202 latches the address placed on the address bus 204, and the input register 218 latches the data placed on the data bus 216. Typically on the next subsequent rising edge of the external clock signal CLK, the latched address is output to the address decoder 206, which decodes the address and activates the addressed memory cells in the memory-cell array 208, and the latched data stored in the input register 218 is output to the write driver circuits 250. The write driver circuits 250 operate as previously described to write the data to the addressed memory cells in the memory-cell array 208. The use of the temperature compensation device 60 makes it possible to use T-RAM memory cells 58 in the array 208 without significant risk of lost data and without excessive power consumption, despite wide variations in ambient temperature.

Figure 13:
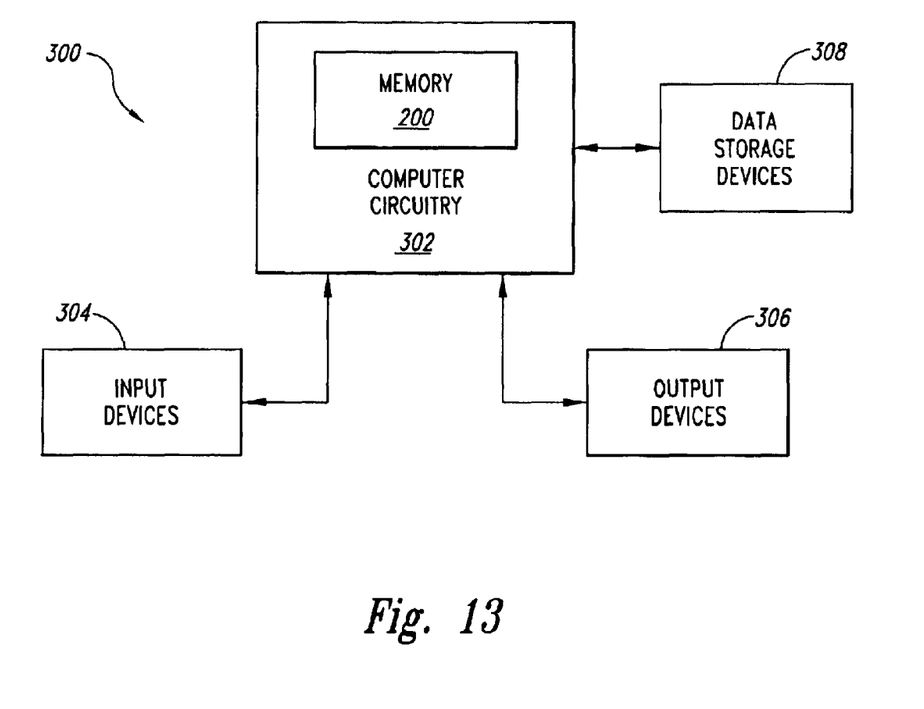
FIG. 13 is a block diagram of a computer system using the synchronous SRAM of FIG. 11.

FIG. 13 is a block diagram of a computer system 300 including the synchronous SRAM 200 of FIG. 12. The computer system 300 includes computer circuitry 302 for performing various computing functions, such as executing specific software to perform specific calculations or tasks. In addition, the computer system 300 includes one or more input devices 304, such as a keyboard or a mouse, coupled to the computer circuitry 302 to allow an operator to interface with the computer system 300. Typically, the computer system 300 also includes one or more output devices 306 coupled to the computer circuitry 302, such output devices typically being a printer or a video terminal. One or more data storage devices 308 are also typically coupled to the computer circuitry 302 to store data or retrieve data from external storage media (not shown). Examples of typical data storage devices 308 include hard and floppy disks, tape cassettes, and compact disk read-only memories (CD-ROMs). The computer circuitry 302 is typically coupled to the synchronous SRAM 200 through a control bus, a data bus, and an address bus to provide for writing data to and reading data from the synchronous SRAM 200.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A temperature compensation device for compensating for temperature variations in a T-RAM, the temperature compensation device comprising:
   a current source; and
   a diode-connected transistor coupled in series with the current source so that substantially all of the current from the current source is directed through the diode-connected transistor, a temperature compensating reference voltage being generated at a junction between the current source and the diode-connected transistor, the temperature compensating reference voltage being coupled to a gate of a current access transistor in the T-RAM, the current access transistor being of the same type as the diode-connected transistor.

2. The temperature compensation device of claim 1 wherein the current source comprises a temperature sensitive current source.

3. The temperature compensation device of claim 1 wherein the temperature sensitive current source comprises a bandgap-based current source.

4. The temperature compensation device of claim 1 wherein the current source comprises:
   a current generator; and
   a current mirror having a first current mirror transistor coupled as a diode in series with the current generator.

5. The temperature compensation device of claim 1, further comprising a non-volatile register coupled to the current source, the non-volatile register being programmable to set the magnitude of the current provided by the current source.

6. The temperature compensation device of claim 5 wherein the non-volatile register is further programmable to set a temperature coefficient of the current provided by the current source.

7. The temperature compensation device of claim 5 wherein the non-volatile register comprises a bank of anti-fuses.

8. The temperature compensation device of claim 1 further comprising a voltage driver having an input coupled to receive the reference voltage.

9. The temperature compensation device of claim 8 wherein the voltage driver comprises an operational amplifier coupled as a voltage-follower.

* * * * *

UNITED STATES PATENT AND TRADEMARK OFFICE
CERTIFICATE OF CORRECTION

PATENT NO. : 6,934,209 B2
APPLICATION NO. : 10/404859
DATED : August 23, 2005
INVENTOR(S) : Ken W. Marr It is certified that error appears in the above-identified patent and that said Letters Patent is hereby corrected as shown below:

| Column, Line | Reads | Should Read |
|---|---|---|
| Column 1, Line 8 | "Jun. 6, 2002 now U.S." | --Jun. 6, 2002, now U.S.-- |
| Column 1, Line 30 | "rely upon the principal" | --rely upon the principle-- |
| Column 2, Line 59 | "thyristor 42 is in its conductive" | --thyristor 42 in its conductive-- |
| Column 3, Lines 41 and 47 | "diagram a temperature" | --diagram of a temperature-- |
| Column 4, Line 16 | "to provides a sub-threshold current" | --to provide a sub-threshold current-- |
| Column 4, Line 67 | "[reference voltage $V_{REF}$]word line voltage WL" | --word line voltage WL-- |
| Column 5, Line 57 | "may be implement," | --may be implemented,-- |
| Column 5, Line 66 | "$I_1$ shown in FIG. 4," | --$I_1$ as shown in FIG. 4," |
| Column 6, Lines 40-41 and Line 55 | "As it is well-known" | --As is well-know-- |

UNITED STATES PATENT AND TRADEMARK OFFICE
CERTIFICATE OF CORRECTION

PATENT NO.       : 6,934,209 B2
APPLICATION NO.  : 10/404859
DATED            : August 23, 2005
INVENTOR(S)      : Ken W. Marr It is certified that error appears in the above-identified patent and that said Letters Patent is hereby corrected as shown below:

| Column, Line | Reads | Should Read (Continued) |
|---|---|---|
| Column 7, Line 1 | "back to the inverting terminal" | --back to the noninverting terminal-- |

Signed and Sealed this

Twenty-sixth Day of February, 2008

JON W. DUDAS
*Director of the United States Patent and Trademark Office*